(12) United States Patent
Kim et al.

(10) Patent No.: US 7,932,887 B2
(45) Date of Patent: Apr. 26, 2011

(54) GATE DRIVING CIRCUIT AND DISPLAY APPARATUS HAVING THE SAME

(75) Inventors: Sung-Man Kim, Seoul (KR);
Myung-Koo Hur, Cheonan-si (KR);
Jong-Hwan Lee, Anyang-si (KR);
Hong-Woo Lee, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 848 days.

(21) Appl. No.: 11/761,149

(22) Filed: Jun. 11, 2007

(65) Prior Publication Data
US 2008/0001904 A1    Jan. 3, 2008

(30) Foreign Application Priority Data

Jun. 12, 2006   (KR) .................. 10-2006-0052612

(51) Int. Cl.
*G09G 3/36* (2006.01)
(52) U.S. Cl. .................. 345/100; 377/64
(58) Field of Classification Search ............ 345/87–104; 377/64–81
See application file for complete search history.

(56) References Cited

U.S. PATENT DOCUMENTS

| | | | |
|---|---|---|---|
| 6,774,398 B2 * | 8/2004 | Jang et al. | 257/59 |
| 6,801,194 B2 | 10/2004 | Miyazawa et al. | |
| 7,405,716 B2 * | 7/2008 | Lee et al. | 345/87 |
| 2005/0275609 A1 * | 12/2005 | Lee et al. | 345/82 |
| 2005/0275614 A1 * | 12/2005 | Kim et al. | 345/100 |
| 2006/0017686 A1 * | 1/2006 | Park | 345/100 |
| 2006/0038500 A1 * | 2/2006 | Lee et al. | 315/169.1 |
| 2006/0056267 A1 * | 3/2006 | Kim et al. | 365/230.06 |
| 2006/0267912 A1 * | 11/2006 | Lee et al. | 345/100 |
| 2007/0052658 A1 * | 3/2007 | Kim | 345/100 |
| 2007/0146289 A1 * | 6/2007 | Lee et al. | 345/100 |
| 2007/0192659 A1 * | 8/2007 | Kang et al. | 714/726 |
| 2007/0296681 A1 * | 12/2007 | Kim et al. | 345/100 |
| 2008/0012816 A1 * | 1/2008 | Moon | 345/100 |
| 2008/0036725 A1 * | 2/2008 | Lee et al. | 345/100 |
| 2008/0048712 A1 * | 2/2008 | Ahn et al. | 326/21 |
| 2008/0068358 A1 * | 3/2008 | Lee et al. | 345/204 |

FOREIGN PATENT DOCUMENTS

| | | |
|---|---|---|
| JP | 2001-282169 | 10/2001 |
| JP | 2002-215118 | 6/2007 |
| KR | 10-2002-0031064 | 4/2002 |
| KR | 10-2005-0104895 | 11/2005 |

\* cited by examiner

*Primary Examiner* — Alexander Eisen
*Assistant Examiner* — Patrick Marinelli
(74) *Attorney, Agent, or Firm* — H.C. Park & Associates, PLC

(57) ABSTRACT

A gate driving circuit includes stages connected in series. In a stage, a pull-up part pulls up a present gate signal to a level of a first clock signal, and a pull-down part receives a next gate signal from a next stage to discharge the present gate signal to an off-voltage. A pull-up driving part turns on or turns off the pull-up part and the carry part. A holding part holds the present gate signal at the off-voltage and a present inverter turns on or turns off the holding part in response to the first clock signal. A ripple preventing capacitor is connected between a present node and an output terminal of a previous stage's inverter to prevent a ripple at the present Q-node in response to an output signal from the previous inverter.

14 Claims, 11 Drawing Sheets

GATE DRIVING CIRCUIT AND DISPLAY APPARATUS HAVING THE SAME

CROSS REFERENCE TO RELATED APPLICATION

This application claims the benefit of and priority from Korean Patent Application No. 2006-52612, filed on Jun. 12, 2006, which is hereby incorporated by reference for all purposes as if fully set forth herein.

BACKGROUND OF THE INVENTION

1. Field of the Invention

The present invention relates to a gate driving circuit and a display apparatus having the gate driving circuit. More particularly, the present invention relates to a gate driving circuit capable of improving output characteristics thereof and a display apparatus having the gate driving circuit.

2. Discussion of the Background

In general, a liquid crystal display (LCD) device includes an LCD panel having a lower substrate, an upper substrate connected to and facing the lower substrate, and a liquid crystal layer interposed between the lower substrate and the upper substrate in order to display an image.

The LCD panel includes a plurality of gate lines, a plurality of data lines and a plurality of pixels. Each pixel may be connected to a gate line and a data line. More specifically, a control electrode or gate electrode of a pixel thin film transistor may be connected to a gate line, and an input electrode of the pixel thin film transistor may be connected to the data line. A gate driving circuit can be directly formed on the LCD panel through a thin film forming process. The gate driving circuit may be connected to each gate line, and may sequentially output a gate signal to each gate line.

Generally, a gate driving circuit includes a shift register in which stages are connected in series. Each stage may include driving transistors arranged to apply a gate signal, such as a voltage signal with a level corresponding to a turn-on voltage or a turn-off voltage, to a corresponding gate line of the gate lines. Specifically, each stage may include a pull-up transistor connected to a gate line to output a gate signal, and a carry transistor connected to an input terminal of a next stage in the series of stages to output a carry signal used to control the driving of the next stage. Therefore, because separate transistors output the gate signal and the carry signal, the gate driving circuit may prevent a distorted signal caused by a load connected to the gate line from being applied to the next stage.

However, in a conventional gate driving circuit, a control terminal of the pull-up transistor and a control terminal of the carry transistor are commonly connected to a node, referred to as the Q-node, in a stage. Further, the Q-node should be maintained at an electric potential corresponding to a turn-off voltage lower than a threshold voltage of the pull-up transistor and the carry transistor during a (n−1)H period, which is after a 1H period, where a gate signal and a carry signal have a low level. The Q-node may then be maintained at an electric potential corresponding to a turn-on voltage that is higher than the threshold voltage of the pull-up transistor and the carry transistor during a 1H period when the gate signal and the carry signal have a high level.

However, in a conventional structure, a ripple phenomenon may occur at the Q-node during the (n−1)H period. More specifically, because of a first clock signal and a second clock signal applied to the gate driving circuit, the electric potential at the Q-node may not remain constant but, rather, may vary or ripple. When the electric potential at the Q-node ripples, the electric potential may exceed a threshold voltage of the pull-up transistor and the carry transistor, and as a result the pull-up transistor and the carry transistor may not remain off during the (n−1)H period. Consequently, a level of the gate signal and a level of the carry signal may also ripple.

SUMMARY OF THE INVENTION

This invention provides a gate driving circuit capable of improving output characteristics thereof.

The present invention also provides a display apparatus having the above gate driving circuit.

Additional features of the invention will be set forth in the description which follows, and in part will be apparent from the description, or may be learned by practice of the invention.

The present invention discloses a gate driving circuit including a first stage, a second stage connected in series with the first stage, and a third stage connected in series with the first stage and the second stage. Further, the second stage includes a present pull-up part to pull up a level of a present gate signal of the second stage, a carry part to pull up a level of a present carry signal of the second stage, a pull-down part to discharge the present gate signal to an off-voltage in response to a next gate signal from the third stage, a pull-up driving part to turn on the present pull-up part and the carry part in response to a previous carry signal of the first stage, and to turn off the present pull-up part and the carry part in response to the next gate signal, the pull-up driving part being connected to a present Q-node connected to a control terminal of the carry part and a control terminal of the present pull-up part, a holding part to maintain a level of the present gate signal at the off-voltage, a present inverter to turn on the holding part in response to a first clock signal, and a ripple preventing capacitor comprising a first terminal connected to the present Q-node and a second terminal connected to an output terminal of a previous inverter of the first stage to prevent a ripple at the present Q-node in response to an output signal from the previous inverter.

The present invention also discloses a gate driving circuit including a first stage, a second stage connected in series with the first stage, and a third stage connected in series after the second stage. Further, the second stage includes a present pull-up part to pull up a level of a present gate signal of the second stage, a carry part to pull up a level of a present carry signal of the second stage, a pull-down part to discharge the present gate signal to an off-voltage in response to a third gate signal from the third stage, a pull-up driving part to turn on the present pull-up part and the carry part in response to a previous carry signal of the first stage, and to turn off the present pull-up part and the carry part in response to the next gate signal, the pull-up driving part being connected to a present Q-node connected to a control terminal of the carry part and a control terminal of the present pull-up part, a holding part to maintain a level of the present gate signal at the off-voltage, a present inverter to turn on the holding part in response to a first clock signal, and a ripple preventing capacitor comprising a first terminal connected to the present Q-node and a second terminal connected to an output terminal of a next inverter of the next stage to prevent a ripple at the second Q-node in response to an output signal from the next inverter.

The present invention also discloses a display apparatus, including a display portion to display an image corresponding to a data signal in response to a gate signal, a data driving circuit to apply the data signal to the display portion, and a gate driving circuit including a first stage, a second stage, and a third stage connected in series to output a previous gate signal, a present gate signal, and a next gate signal, respectively, to the display portion. Further, the second stage includes a present pull-up part to pull up a level of the present gate signal, a carry part to pull up a level of a present carry signal of the second stage, a pull-down part to discharge the present gate signal to an off-voltage in response to the next gate signal, a pull-up driving part to turn on the present pull-up part and the carry part in response to a previous carry signal of the first stage, and to turn off the present pull-up part and the carry part in response to the next gate signal, the pull-up driving part being connected to a present Q-node connected to a control terminal of the carry part and a control terminal of the present pull-up part, a holding part to maintain a level of the present gate signal at the off-voltage, a present inverter to turn on the holding part in response to a first clock signal, and a ripple preventing capacitor comprising a first terminal connected to the present Q-node and a second terminal connected to an output terminal of a previous inverter of the first stage to prevent a ripple at the present Q-node in response to an output signal from the previous inverter.

The present invention also discloses a display apparatus, including a display portion to display an image corresponding to a data signal in response to a gate signal, a data driving circuit to apply the data signal to the display portion, and a gate driving circuit including a first stage, a second stage connected in series with the first stage, and a third stage connected in series after the second stage, the first stage, the second stage, and the third stage to output a previous gate signal, a present gate signal, and a next gate signal, respectively, to the display portion. Further, the second stage includes a present pull-up part to pull up a level of the present gate signal, a carry part to pull up a level of a present carry signal of the second stage, a pull-down part to discharge the present gate signal to an off-voltage in response to the next gate signal, a pull-up driving part to turn on the present pull-up part and the carry part in response to a first carry signal of the first stage, and to turn off the present pull-up part and the carry part in response to the next gate signal, the pull-up driving part being connected to a present Q-node connected to a control terminal of the carry part and a control terminal of the present pull-up part, a holding part to maintain a level of the present gate signal to the off-voltage, a present inverter to turn on the holding part in response to a first clock signal, and a ripple preventing capacitor comprising a first terminal connected to the present Q-node and a second terminal connected to an output terminal of a next inverter of the third stage to prevent a ripple at the present Q-node in response to an output signal from the next inverter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
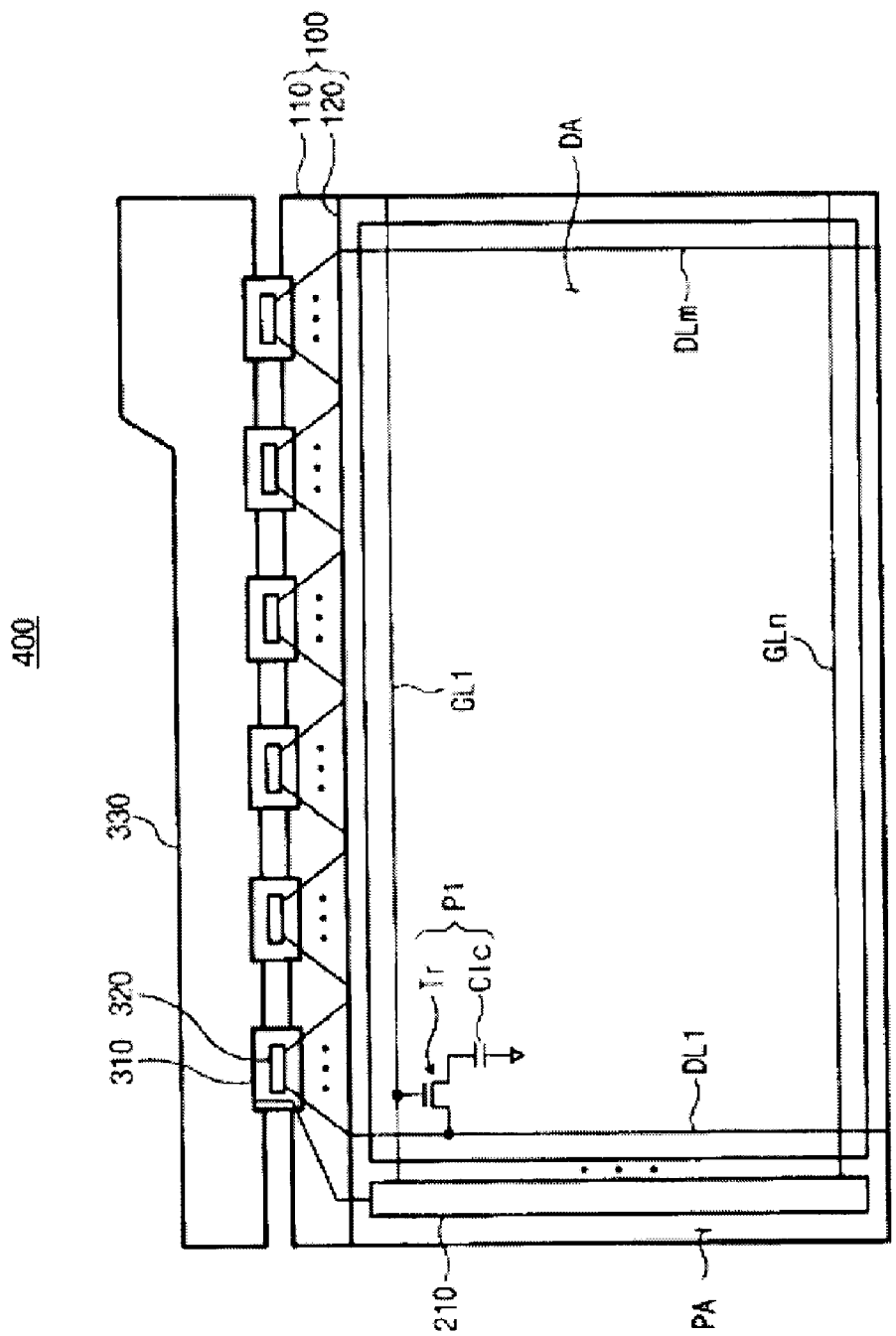
FIG. 1 is a plan view showing of an LCD apparatus according to an exemplary embodiment the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on", "connected to" or "coupled to" another element or layer, it can be directly on, connected or coupled, whether mechanically, electrically, or otherwise, to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view showing an LCD apparatus according to an exemplary embodiment of the present invention.

Referring to FIG. 1, an LCD apparatus 400 may include an LCD panel 100 for displaying an image, data driving chips 320 for outputting a data signal to the LCD panel 100, and a gate driving circuit 210 for outputting a gate signal to the LCD panel 100.

The LCD panel 100 may include a lower substrate 110, an upper substrate 120 facing and connected to the lower substrate 110, and a liquid crystal layer (not shown) interposed between the lower substrate 110 and the upper substrate 120. The LCD panel 100 may include a display area DA on which an image is displayed, and a peripheral area PA adjacent to the display area DA.

In the display area DA, pixel areas may be arranged in a matrix configuration. The display area DA may also include gate lines GL1 to GLn (where n is an integer equal to or greater than 1) extending in a first direction, and data lines DL1 to DLm (where m is an integer equal to or greater than 1) insulated from the gate lines GL1 to GLn and extending in a second direction substantially perpendicular to the first direction. Each pixel area defined by the gate lines and data lines may include a pixel P1 having a thin film transistor Tr and a liquid crystal capacitor Clc including two opposing electrodes. The thin film transistor Tr may include a gate electrode connected to a first gate line GL1, a source electrode connected to a first data line DL1, and a drain electrode connected to a pixel electrode. The pixel electrode may serve as a first electrode of the liquid crystal capacitor Clc.

The gate driving circuit 210 may be formed in the peripheral area PA adjacent to first ends of the gate lines GL1 to GLn. The gate driving circuit 210 may be connected to a first end of each gate line GL1 to GLn and may apply the gate signal sequentially to each gate line GL1 to GLn.

A plurality of tape carrier packages (TCPs) 310 may be connected to the peripheral area PA adjacent to a first end of the data lines DL1 to DLm. The data driving chips 320 may be mounted on the TCPs 310. A data driving chip 320 may be connected to one end of one or more data lines DL1 to DLm and may output the data signal to those data line DL1 to DLm.

The LCD apparatus 400 may also include a printed circuit board 330 to control the driving of the gate driving circuit 210 and the data driving chips 320. The printed circuit board 330 may output a data control signal and image data for the data driving chips 320, and may output a gate control signal for the gate driving circuit 210. The data control signal and the image data may be applied to the data driving chips 320 through the TCPs 310. The gate control signal may be applied to the gate driving circuit 210 through a TCP 310 that is substantially near the gate driving circuit 210.

Figure 2:
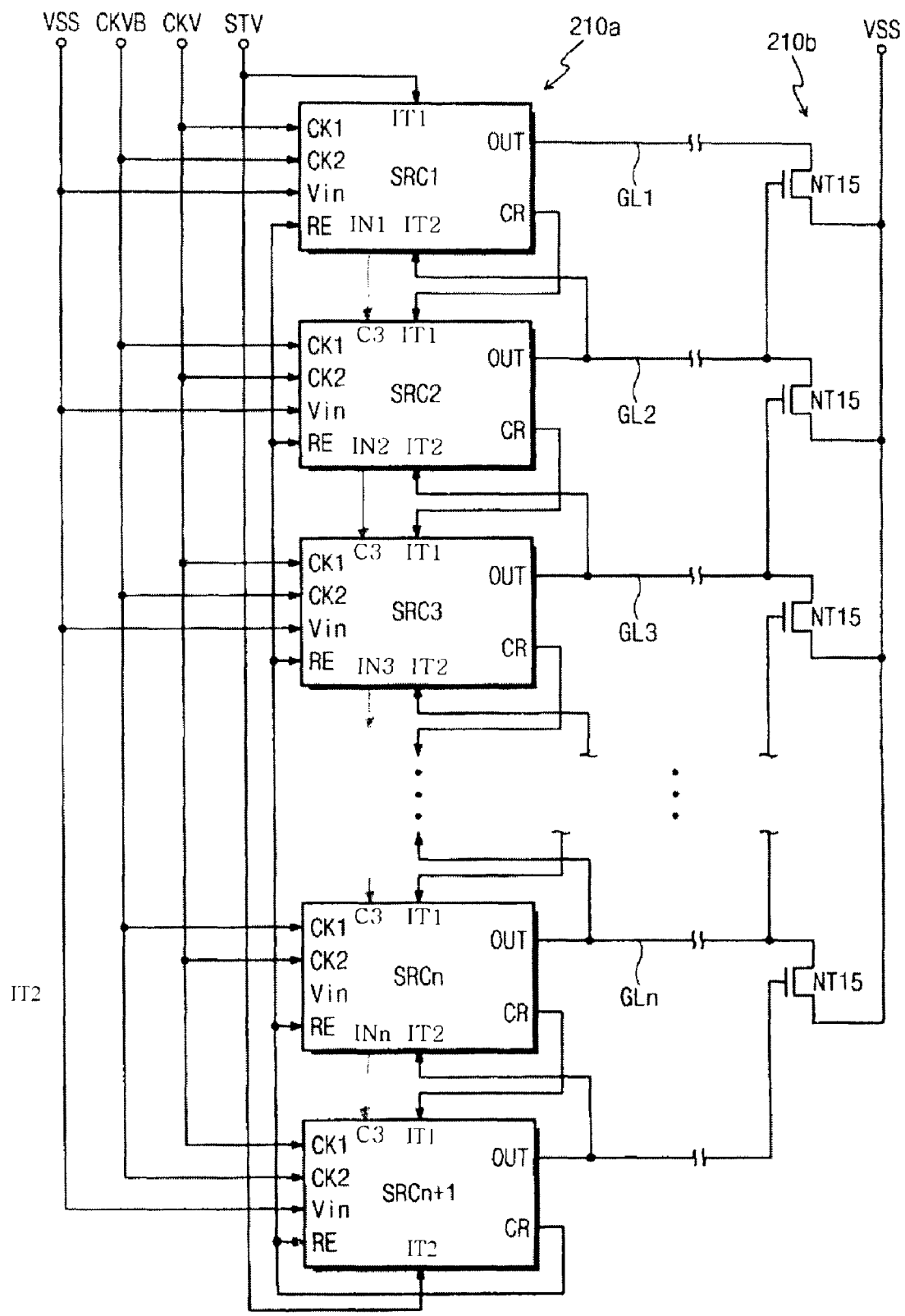
FIG. 2 is a block diagram showing a gate driving circuit shown in FIG. 1.

FIG. 2 is a block diagram showing the gate driving circuit shown in FIG. 1. Referring to FIG. 2, the gate driving circuit 210 may include a shift register 210a having stages SRC1 to SRCn+1 connected in series. Each stage may include a first input terminal IT1, a first clock terminal CK1, a second clock terminal CK2, a second input terminal IT2, a voltage input terminal Vin, a reset terminal RE, an output terminal OUT, and a carry terminal CR.

The first input terminal IT1 of the stages SRC2 to SRCn+1 may be connected to a carry terminal CR of a previous stage to receive a previous carry signal. In the present exemplary embodiment, the first input terminal IT1 of a first stage SRC1 may receive a start signal STV that starts the driving of the gate driving circuit 210.

The second input terminal IT2 of the stages SRC1 to SRCn may be connected to an output terminal OUT of a next stage to receive a next gate signal. The second input terminal IT2 of a last stage SRCn+1 may receive the start signal STV.

A first clock signal CKV may be provided to the first clock terminal CK1 and a second clock signal CKVB having an inverted signal with respect to the first clock signal CKV may be provided to the second clock terminal CK2 of odd-numbered stages SRC1, SRC3, . . . SRCn+1. The second clock signal CKVB may be provided to the first clock terminal CK1 and the first clock signal CKV may be provided to the second clock terminal CK2 of even-numbered stages SRC2, . . . SRCn.

An off-voltage VSS may be provided to the voltage input terminal Vin of each stage SRC1 to SRCn+1. Also, the carry terminal CR of the last stage SRCn+1 may be connected to the reset terminal RE of each stage SRC1 to SRCn+1.

The output terminals OUT of the stages SRC1 to SRCn may be connected to the gate lines GL1, GL2, GL3, . . . , GLn, respectively. Therefore, the stages SRC1 to SRCn may output the gate signals sequentially through the output terminals OUT to the gate lines GL1 to GLn.

As shown in FIG. 2, the shift register 210a may be arranged adjacent to a first end of the gate lines GL1 to GLn. The gate driving circuit 210 may also include a discharging circuit 210b arranged adjacent to a second end of the gate lines GL1 to GLn. Discharging circuit 210b may discharge a present gate line GL1 to GLn to the off-voltage VSS in response to a gate signal output from a next stage. The discharging circuit 210b may include the same number of discharging transistors NT15 as the number of the gate lines GL1 to GLn, and each discharging transistor NT15 may have a control electrode connected to a next gate line, an input electrode connected to the off-voltage VSS, and an output electrode connected to the present gate line.

Figure 3:
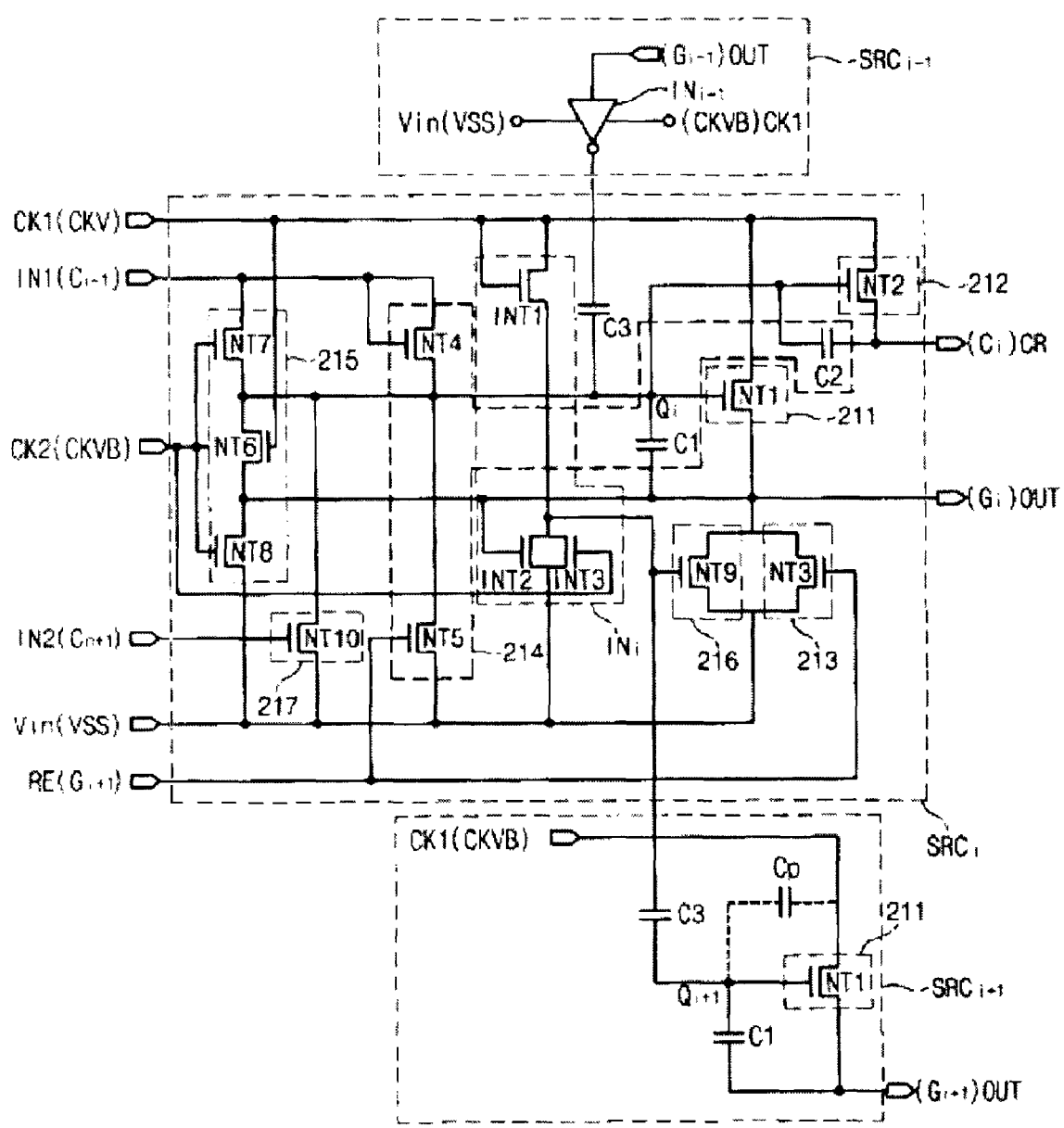
FIG. 3 is a circuit diagram showing the gate driving circuit stage shown in FIG. 2.

FIG. 3 is a circuit diagram showing a gate driving circuit stage of FIG. 2.

In FIG. 3, a circuit diagram of an i-th stage SRCi is shown as an example of one of stages SRC2 to SRCn. Since each stage of the gate driving circuit may have a substantially similar configuration, only the i-th stage SRCi will be described in detail with reference to FIG. 3. The detailed descriptions of the other stages will be omitted. In the present embodiment, 'i' may be an integer larger than '1' and smaller than 'n'.

Referring to FIG. 3, an i-th stage SRCi may include a pull-up part 211, a carry part 212, a pull-down part 213, a pull-up driving part 214, a ripple preventing part 215, a holding part 216, an i-th inverter INi, and a reset part 217.

The pull-up part 211 may include a pull-up transistor NT1 having a control electrode connected to an output terminal (hereinafter referred to as i-th Q-node Qi) of the pull-up driving part 214. Hereinafter, the output terminal of the pull-up driving part 214 shall be referred to as the i-th Q-node Qi. The pull-up transistor NT1 may also include an input electrode connected to the first clock terminal CK1, and an output electrode connected to the output terminal OUT. Thus, in response to a level of the electric potential at the i-th Q-node Qi, the pull-up transistor NT1 may pull up a level of an i-th gate signal Gi output from the output terminal OUT to a level of the first clock CKV applied through the first clock terminal CK1. The pull-up transistor NT1 may be turned on only during a 1H period when the first clock signal CKV has a high level to maintain the i-th gate signal Gi at a high level during the 1H period.

The carry part 212 may include a carry transistor NT2 having a control electrode connected to the i-th Q-node Qi, an input electrode connected to the first clock terminal CK1, and an output electrode connected to the carry terminal CR. In response to a level of the electric potential at the i-th Q-node Qi, the carry transistor NT2 may pull up a level of an i-th carry signal Ci output from the carry terminal CR. The carry transistor NT2 may be turned on only during the 1H period when the first clock signal CKV has a high level to maintain the i-th carry signal Ci at a high level during the 1H period.

The pull-down part 213 may include a pull-down transistor NT3 having a control electrode connected to the second terminal IT2 to receive a next gate signal Gi+1, an input electrode connected to the voltage input terminal Vin to receive the off-voltage VSS, and an output electrode connected to the output terminal OUT. In response to the (i+1)th gate signal Gi+1, the pull-down transistor NT3 may pull down a level of the i-th gate signal Gi to the off-voltage VSS supplied to the voltage input terminal Vin. Thus, the pull-down transistor NT3 may be turned on after the 1H period and may pull down a level of the i-th gate signal Gi to a low level corresponding to off-voltage VSS.

The pull-up driving part 214 may include a buffer transistor NT4, a first capacitor C1, a second capacitor C2, and a discharge transistor NT5. The buffer transistor NT4 may include an input electrode and a control electrode commonly connected to the first input terminal IT1 to receive a previous carry signal Ci−1, and an output electrode connected to the i-th Q-node Qi. The first capacitor C1 may be connected between the i-th Q-node Qi and the output terminal OUT, and the second capacitor C2 may be connected between the control electrode of the carry transistor NT2 and the carry terminal CR. The discharge transistor NT5 may include an input electrode connected to the output electrode of the buffer transistor NT4, a control electrode connected to the second input terminal IT2, and an output electrode connected to the voltage input terminal Vin.

When the buffer transistor NT4 is turned on in response to an (i−1)th carry signal Ci−1, a level of the i-th Q-node may increase by a level of the (i−1)th carry signal Ci−1, and the electric potential of the i-th Q-node Qi may be additionally boosted due to the first capacitor C1 and the second capacitor C2 during the high period 1H of the first clock CKV. Thus, the level of the i-th Q-node Qi may exceed a threshold voltage, so that the pull-up transistor NT1 and the carry transistor NT2 may be turned on. Consequently, the first clock signal CKV may be output to the output terminal OUT and to the carry terminal CR, thereby shifting the i-th gate signal Gi and the i-th carry signal Ci to a high level. That is, the i-th gate signal Gi and the i-th carry signal Ci may be maintained at a high level when the first clock signal CKV has a high level during the 1H period.

Then, when the discharge transistor NT5 is turned on in response to the (i+1)th gate signal Gi+1, the charges stored in the first capacitor C1 may be discharged to the off-voltage VSS through the discharge transistor NT5. Thus, the level of the i-th Q-node Qi may be shifted to a level corresponding to the off-voltage VSS, so that the pull-up transistor NT1 and the carry transistor NT2 may be turned off. The discharge transistor NT5 may be turned on after the 1H period to turn off the pull-up transistor NT1 and turn off the carry transistor NT2. Thus, the discharge transistor NT5 may prevent output of the i-th gate signal Gi with a high level to the output terminal OUT and may prevent output of the i-th carry signal Ci with a high level to the carry terminal CR after the 1H period.

The ripple preventing part 215 may include a first ripple preventing transistor NT6, a second ripple preventing transistor NT7, and a third ripple preventing transistor NT8. The ripple preventing part 215 may prevent the i-th gate signal Gi and the i-th carry signal Ci from being rippled by the first clock signal CKV and the second clock signal CKVB during a period of a frame remaining after the 1H period, hereinafter, referred to as the (n−1)H period.

The first ripple preventing transistor NT6 may include a control electrode connected to the first clock terminal CK1, an input electrode connected to the output terminal OUT, and an output electrode connected to the i-th Q-node Qi. The second ripple preventing transistor NT7 may include a control electrode connected to the second clock terminal CK2, an input electrode connected to the first input terminal IT1, and an output electrode connected to the i-th Q-node Qi. The third ripple preventing transistor NT8 may include a control electrode connected to the second clock terminal CK2, an input electrode connected to the output terminal OUT, and an output electrode connected to the voltage input terminal Vin.

The first ripple preventing transistor NT6 may provide a present gate signal Gi having a substantially similar level as that of the off-voltage VSS from the output terminal OUT to the i-th Q-node Qi in response to the first clock signal CKV during the (n−1)H period. Thus, during the (n−1)H period of the first clock signal CKV, the level of the i-th Q-node Qi may be maintained at a level corresponding to the off-voltage VSS. As a result, the first ripple preventing transistor NT6 may prevent the pull-up transistor NT1 and the carry transistor NT2 from turning on when the first clock signal CKV has a high level during the (n−1)H period.

The second ripple preventing transistor NT7 may provide the (i−1)th carry signal Ci−1 having a level corresponding to the off-voltage VSS to the i-th Q-node Qi in response to the second clock signal CKVB provided to the second clock terminal CK2 during the (n−1)H period. Thus, a level of the i-th Q-node Qi may be maintained at a level of the off-voltage VSS when the second clock signal CKVB has a high level during the (n−1)H period. As a result, the second ripple preventing transistor NT7 may prevent the pull-up transistor NT1 and the carry transistor NT2 from turning on when the second clock signal CKVB has a high level during the (n−1)H period.

The third ripple preventing transistor NT8 may discharge the i-th gate signal Gi to the off-voltage VSS in response to the second clock signal CKVB. Thus, the third ripple preventing transistor NT8 may maintain a level of the i-th gate signal Gi at a level of the off-voltage VSS when the second clock signal CKVB has a high level during the (n−1)H period.

The ripple preventing part 215 may also include a ripple preventing capacitor C3 having a first terminal connected to the i-th Q-node Qi and a second terminal connected to an output terminal of an (i−1)th inverter INi−1 of an (i−1)th stage SRCi−1.

The holding part 216 may include a holding transistor NT9 having a control electrode connected to the output terminal of the i-th inverter INi, an input electrode connected to the voltage input terminal Vin, and an output electrode connected to the output terminal OUT.

The i-th inverter INi may include a first inverter transistor INT1, a second inverter transistor INT2 and a third inverter transistor INT3. The output terminal of the i-th inverter INi may be connected to the control electrode of the holding transistor NT9 to turn the holding transistor NT9 on and off, and may be connected to a second terminal of a ripple preventing capacitor C3 of a next stage SRCi+1 to control the charging and discharging of the ripple preventing capacitor C3 of the next stage SRCi+1.

The first inverter transistor INT1 may include an input electrode and a control electrode commonly connected to the first clock terminal CK1 to receive the first clock signal CKV, and an output electrode (hereinafter, referred to as 'output terminal of the i-th inverter INi') connected to the control electrode of the holding transistor NT9. The second inverter transistor INT2 may include a control electrode connected to the output terminal OUT to output the i-th gate signal Gi, an input electrode connected to the voltage input terminal Vin to receive the off-voltage VSS, and an output electrode connected to the output terminal of the i-th inverter INi. In another exemplary embodiment of the present invention, the control electrode of the second inverter transistor INT2 may be connected to the i-th Q-node Qi. The third inverter transistor INT3 may include a control electrode connected to the second clock terminal CK2 to receive the second clock signal CKVB, an input electrode connected to the voltage input terminal Vin to receive the off-voltage VSS, and an output electrode connected to the i-th inverter INi output terminal.

The first inverter transistor INT1 may be turned on when the first clock signal CKV has a high level, and may then output the first clock signal CKV. The second inverter transistor INT2 may be turned on when the i-th gate signal Gi has a high level to discharge the first clock signal CKV, which was output from the first inverter transistor INT1, to the off-voltage VSS. Thus, the off-voltage VSS may be output to the i-th inverter INi output terminal, and therefore may be provided to the control electrode of the holding transistor NT9. When the off-voltage VSS is provided to the gate electrode of the holding transistor NT9, which may occur during the 1H period when the i-th gate signal Gi has a high level, the holding transistor NT9 may be turned off.

The second inverter transistor INT2 may be turned off when the i-th gate signal Gi transitions to a low level, and the first clock signal CKV output from the first inverter transistor INT1 may be provided to the control electrode of the holding transistor NT9 to turn on the holding transistor NT9. The holding transistor NT9, when turned on, may transmit the off-voltage VSS to the output terminal OUT and gate line GLi. Consequently, the i-th gate signal Gi may be maintained at the off-voltage VSS by the holding transistor NT9.

The third inverter transistor INT3 may be turned on in response to the second clock signal CKVB and may provide the off-voltage VSS to the output terminal of the i-th inverter INi when the second clock signal CKVB has a high level, which may correspond to a low level of the first clock signal CKV.

As shown in FIG. 3, the i-th inverter INi output terminal may be connected to the second terminal of the ripple preventing capacitor C3 of the (i+1)th stage SRCi+1. A parasitic capacitor Cp may be formed between the control electrode and the input electrode of the pull-up transistor NT1 of the (i+1)th stage SRCi+1. The second clock signal CKVB may be provided to the input electrode of the pull-up transistor NT1, and the first clock signal CKV output from the i-th inverter INi may be provided to the second terminal of the ripple preventing capacitor C3.

The parasitic capacitor Cp may cause a ripple at the control electrode, hereinafter referred to as the (i+1)th Q-node (Qi+1), of the pull-up transistor NT1 by the second clock signal CKVB. However, since the ripple preventing capacitor C3 may receive the first clock signal CKV having a level opposite that of the second clock signal CKVB, the ripple at the (i+1)th Q-node Qi+1 may be offset.

However, the i-th inverter INi may output the off-voltage VSS not only during the i-th 1H period when the i-th gate voltage Gi has a high level, but also during a 1H period before the i-th 1H period ((i−1)th 1H period) and a 1H period after the i-th 1H period ((i+1)th 1H period). Thus, the i-th inverter INi may prevent the (i+1)th Q-node Qi+1 from discharging to a level corresponding to the off-voltage VSS during the (i+1)th 1H period when the (i+1)th gate signal Gi+1 may have a high level.

As a result, the ripple preventing capacitor C3 of the (i+1)th stage SRCi+1 may be connected to the i-th inverter INi and may be charged or discharged according to the i-th gate signal Gi applied to the i-th inverter INi or the electric potential of the i-th Q-node Qi. Thus, the i-th inverter INi may prevent a ripple at the (i+1)th Q-node Qi+1 during the (i−1)th 1H period and also may prevent the level of the (i+1)th gate signal Gi+1 from discharging to a level corresponding to the off-voltage VSS during the 1H period.

The (i−1)th inverter INi−1 of the (i−1)th stage SRCi+1 may have a substantially similar configuration as that of the i-th inverter INi. That is, the (i−1)th inverter INi+1 may be connected to the second terminal of the ripple preventing capacitor C3 of the i-th stage SRCi, and the (i−1)th inverter INi−1 may charge or discharge the ripple preventing capacitor C3 of the i-th stage SRCi by outputting the second clock signal CKVB according to the (i+1)th gate signal Gi−1 or the electric potential of the (i−1)th Q-node Qi−1 (not shown).

Particularly, the (i−1)th inverter INi+1 may output the off-voltage VSS not only during the (i−1)th 1H period where the i-th gate signal Gi−1 may have a high level, but also during the 1H period before the (i−1)th 1H period ((i−2)th 1H period) and during the 1H period after the (i−1)th 1H period (i-th 1H period). Thus, the (i−1)th inverter may prevent transition of the i-th Q-node Qi to the electric potential of the off-voltage VSS during the i-th 1H period when the i-th gate signal Gi has a high level.

Therefore, the (i−1)th inverter INi−1 may prevents a ripple at the i-th Q-node Qi during the (n−1)H period and may also prevent the voltage level of the i-th gate signal Gi from being lowered by the ripple preventing capacitor C3 during the (n−1)th 1H period.

The reset part 217 may include a reset transistor NT10 having a control electrode connected to a reset terminal RE, an input electrode connected to the control electrode of the pull-up transistor NT1, and an output electrode connected to the voltage input terminal Vin. The reset transistor NT10 may discharge the i-th Q-node Qi to the off-voltage VSS in response to the last carry signal Cn+1 input to the reset terminal RE from the last stage SRCn+1. Thus, the pull-up transistor NT1 and the carry transistor NT2 may be turned off, thereby resetting the i-th stage SRCi.

Hereinafter, exemplary embodiments of the (i−1)th inverter INi−1 will be described in detail with reference to FIG. 4, FIG. 5, FIG. 6, FIG. 7, FIG. 8, and FIG. 9. The following description shall be provided for previous inverter INi−1 for (i−1)th stage SRCi−1 wherein (i−1)th stage SRCi−1 is an even-numbered stage. It is to be understood that the structure of (i−1)th stage SRCi−1 may be modified consistent with this specification if (i−1)th stage SRCi−1 is an odd-numbered stage.

Figure 4:
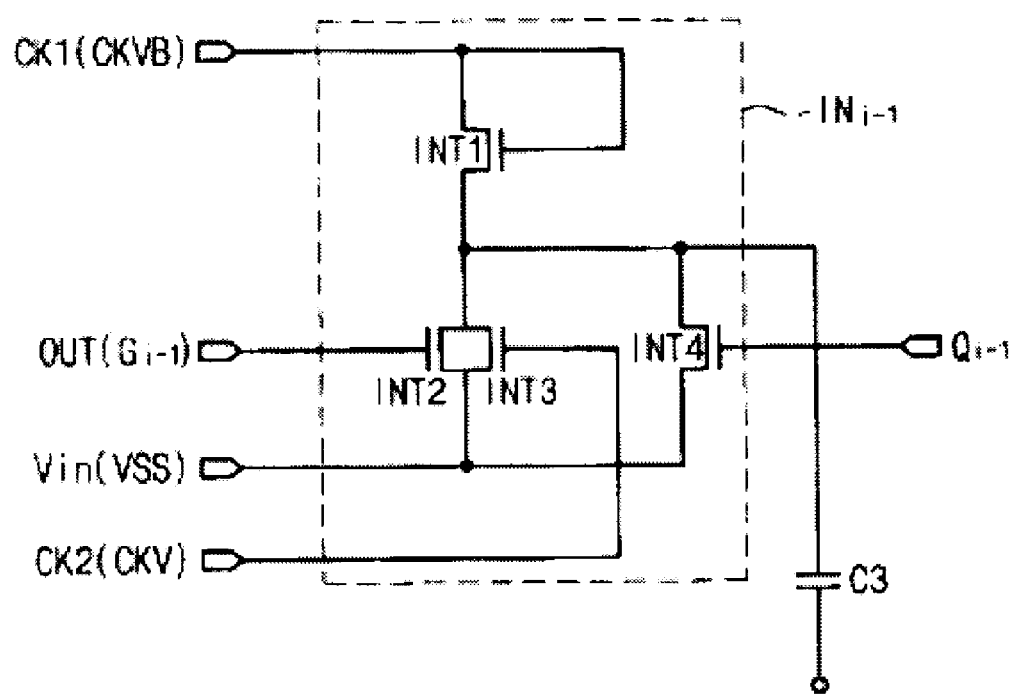
FIG. 4 is an equivalent circuit diagram showing an inverter according to another exemplary embodiment of the present invention.
Figure 5:
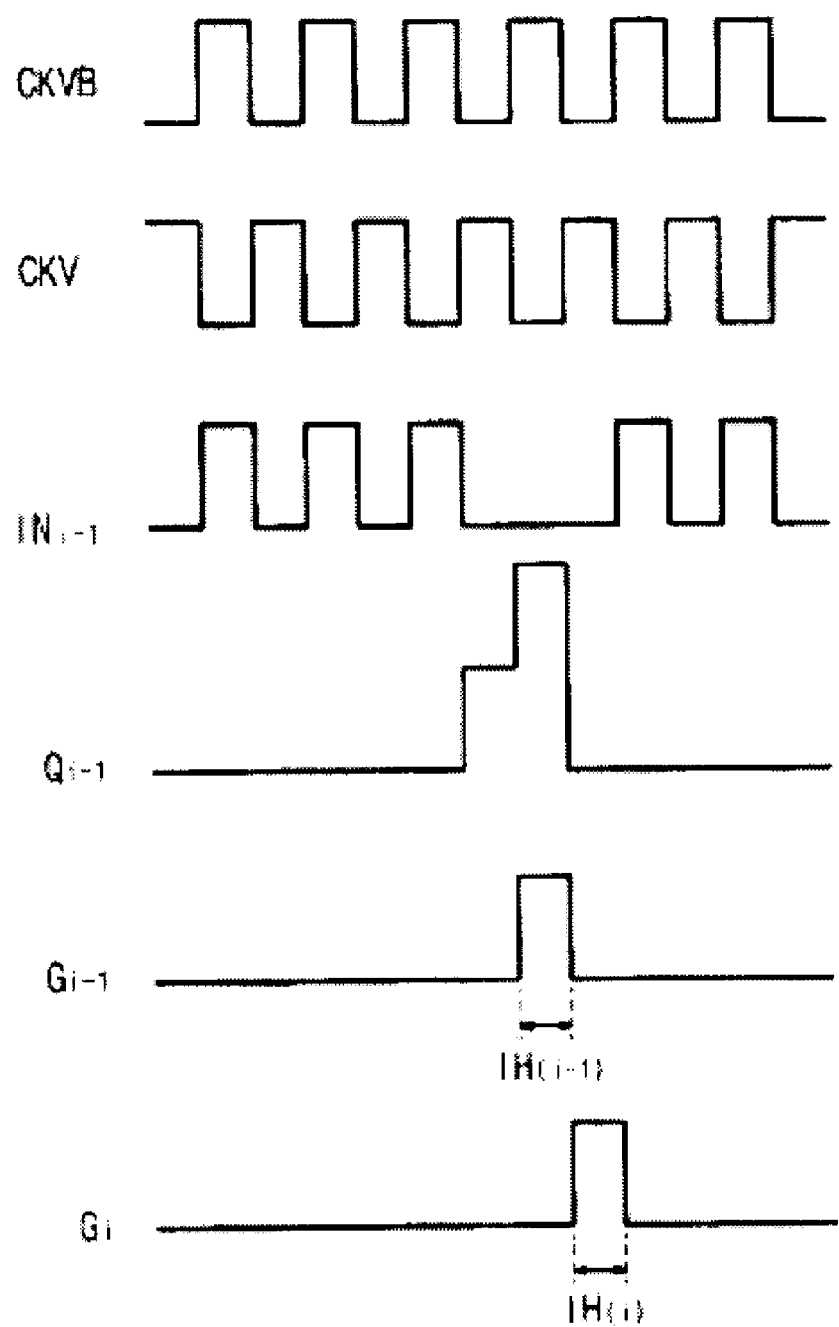
FIG. 5 is a waveform diagram showing an input signal and an output signal of the inverter shown in FIG. 4.

FIG. 4 is an equivalent circuit diagram of an inverter according to another exemplary embodiment of the present invention. FIG. 5 is a waveform diagram of an input signal and an output signal of the inverter shown in FIG. 4.

Referring to FIG. 4, the previous inverter INi−1 according to another exemplary embodiment of the present invention may include a first inverter transistor INT1, a second inverter transistor INT2, a third inverter transistor INT3, and a fourth inverter transistor INT4. The output terminal of the previous inverter INi−1 may be connected to the second terminal of the ripple preventing capacitor C3 of the present stage SRCi.

The first inverter transistor INT1 may include an input electrode and a control electrode commonly connected to the first clock terminal CK1 for receiving the second clock signal CKVB, and an output electrode connected to the second terminal of the ripple preventing capacitor C3. The second inverter transistor INT2 may include a control electrode connected to an output terminal OUT for receiving a gate signal Gi−1, an input electrode connected to a voltage input terminal Vin for receiving the off-voltage VSS, and an output electrode connected to the second terminal of the ripple preventing capacitor C3. The third inverter transistor INT3 may include a control electrode connected to a second clock terminal CK2 for receiving the first clock signal CKV, an input electrode connected to the voltage input terminal Vin for receiving the off-voltage VSS, and an output electrode connected to the second terminal of the ripple preventing capacitor C3. The fourth inverter transistor INT4 may include a control electrode connected to the (i−1)th Q-node Qi−1 of the previous stage SRCi−1, an input electrode connected to the voltage input terminal Vin for receiving the off-voltage VSS, and an output electrode connected to the second terminal of the ripple preventing capacitor C3.

As shown in FIG. 5, the first inverter transistor INT1 may be turned on when the second clock signal CKVB has a high level, and may output the second clock signal CKVB.

The second inverter transistor INT2 may be turned on during the (i−1)th 1H period when the (i−1)th gate signal Gi−1 has a high level to discharge the second clock signal CKVB output from the first transistor INT1 to the off-voltage VSS. Also, the fourth inverter transistor INT4 may be turned on when the electric potential of the (i−1)th Q-node Qi−1 increases, and the output terminal of the (i−1)th inverter may be maintained at the off-voltage VSS.

The third inverter transistor INT3 may be turned on when the first clock signal CKV has a high level, and may provide the off-voltage VSS to the output terminal of the (i−1)th inverter INi−1 when the second clock signal CKVB has a low level, which may correspond to when the first clock signal CKV has a high level. In more detail, the off-voltage VSS may be output to the output terminal of the (i−1)th inverter INi−1 during the i-th 1H period, shown as 1H(i) on FIG. 5, when the i-th gate signal Gi has a high level.

Therefore, the (i−1)th inverter INi−1 may prevent the second clock signal CKVB from being applied to the ripple preventing capacitor C3 of the i-th stage SRCi during the i-th 1H period 1H(i). As a result, the (i−1)th inverter INi−1 may prevent a level of the i-th gate signal Gi from being lowered by the ripple preventing capacitor C3 during the i-th 1H period 1H(i).

When the second inverter transistor INT2 is turned off in response to the (i−1)th gate signal Gi−1 having a low level, the second clock signal CKV output from the first inverter transistor INT1 may be output from the output terminal of the (i−1)th inverter INi−1. Thus, the (i−1)th inverter INi−1 may provide the second clock signal CKVB to the ripple preventing capacitor C3 of the i-th stage SRCi, thereby preventing a ripple at the i-th Q-node Qi of the i-th stage SRCi.

Figure 6:
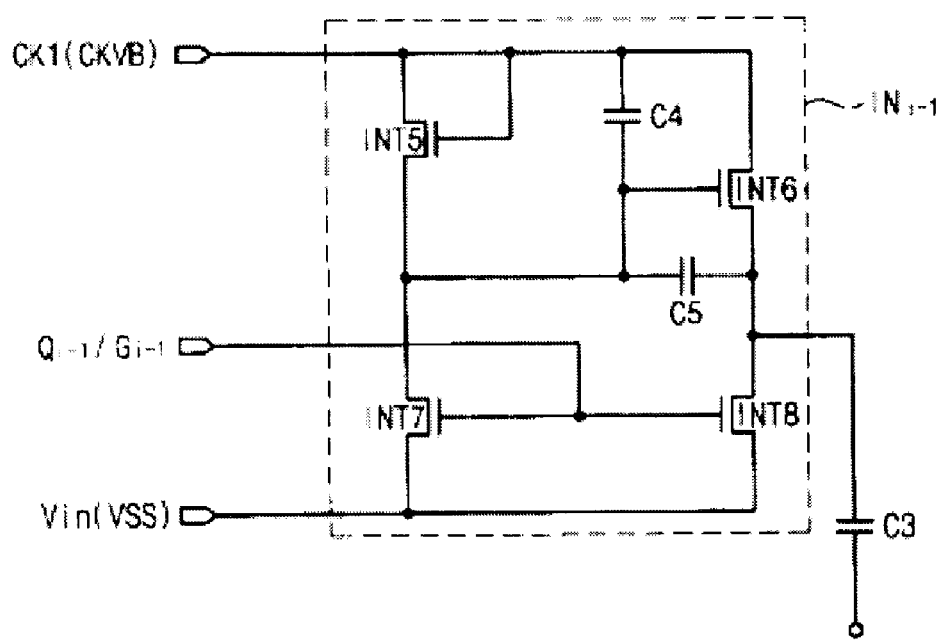
FIG. 6 is an equivalent circuit diagram showing an inverter according to another exemplary embodiment of the present invention.

FIG. 6 is an equivalent circuit diagram of an inverter according to another exemplary embodiment of the present invention.

Referring to FIG. 6, the (i−1)th inverter INi−1 may include a fifth inverter transistor INT5, a sixth inverter transistor INT6, a seventh inverter transistor INT7, an eighth inverter transistor INT8, a fourth capacitor C4, and a fifth capacitor C5. The output terminal of the (i−1)th inverter INi−1 may be connected to the second terminal of the ripple preventing capacitor C3 of the i-th stage SRCi.

The fifth inverter transistor INT5 may include a control electrode and an input electrode commonly connected to the first clock terminal CK1 for receiving the second clock signal CKVB, and an output electrode connected to the output terminal of the (i−1)th inverter INi−1 through the fifth capacitor C5. The sixth inverter transistor INT6 may include an input electrode connected to the first clock terminal CK1 for receiving the second clock signal CKVB, a control electrode connected to the input electrode through the fourth capacitor C4, and an output electrode connected to the control electrode of the sixth inverter transistor INT6 through the fifth capacitor C5 and also connected to the output terminal of the (i−1)th inverter INn−1.

The seventh inverter transistor INT7 may include a control electrode connected to an output terminal OUT for receiving the (i−1)th gate signal Gi−1 or connected to the (i−1)th Q-node Qi−1, an input electrode connected to a voltage input terminal Vin for receiving the off-voltage VSS, and an output electrode connected to the output terminal of the (i−1)th inverter INi−1 through the fifth capacitor C5. The eighth inverter transistor INT8 may include a control electrode connected to an output terminal OUT for receiving the (i−1)th gate signal Gi−1 or connected to the (i−1)th Q-node Qi−1, an input electrode connected to a voltage input terminal Vin for receiving the off-voltage VSS, and an output electrode connected to the output terminal of the (i−1)th inverter INi−1.

Referring to FIG. 5 and FIG. 6, the fifth inverter transistor INT5 and the sixth inverter transistor INT6 may be turned on when the second clock signal CKVB has a high level to output the second clock CKVB.

The seventh inverter transistor INT7 and the eighth inverter transistor INT8 may be turned on during the (i−1)th 1H period when the (i−1)th gate signal Gi−1 or the (i−1)th Q-node Qi−1 may have a high level. When the seventh inverter transistor INT7 and the eighth inverter transistor INT8 are turned on, the second clock signal CKVB output from the fifth inverter transistor INT5 and the sixth inverter transistor INT6 may be discharged to the off-voltage VSS.

Therefore, the (i−1)th inverter INi−1 may prevent the second clock signal CKVB from being applied to the ripple preventing capacitor C3 of the i-th stage SRCi during the i-th 1H period 1H(i). As a result, the (i−1)th inverter INi−1 may prevent a level of the i-th gate signal Gi from being lowered by the ripple preventing capacitor C3 during the i-th 1H period 1H(i).

When the seventh inverter transistor INT7 and the eighth inverter transistor INT8 are turned off in response to the (i−1)th gate signal having a low level, the second clock signal CKV may be output from the output terminal of the (i−1)th inverter INi−1. Thus, the (i−1)th inverter INi−1 may provide the second clock signal CKVB to the ripple preventing capacitor C3 of the i-th stage SRCi, to thereby prevent a ripple at the i-th Q-node Qi of the i-th stage SRCi.

Figure 7:
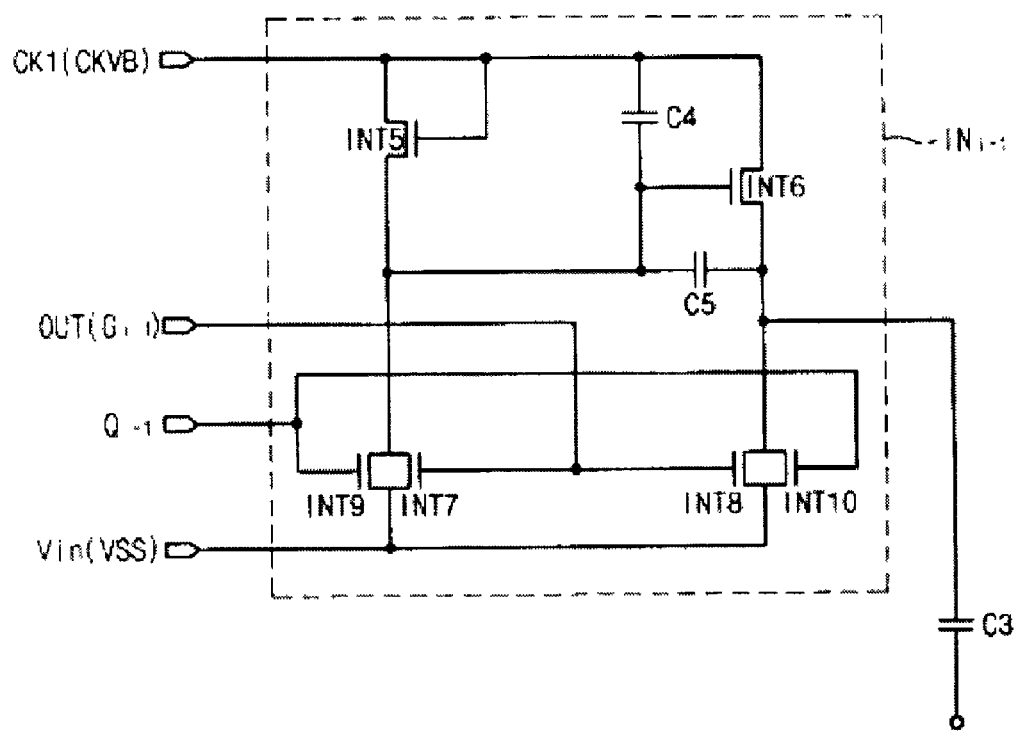
FIG. 7 is an equivalent circuit diagram showing an inverter according to another exemplary embodiment of the present invention.

FIG. 7 is an equivalent circuit diagram of an inverter according to another exemplary embodiment of the present invention. In FIG. 7, the same reference numerals denote the same or substantially similar elements as shown in FIG. 6, and thus the detailed description of these elements will be omitted.

Referring to FIG. 7, the (i−1)th inverter INi−1 may include a fifth inverter transistor INT5, a sixth inverter transistor INT6, a seventh inverter transistor INT7, an eighth inverter transistor INT8, a ninth inverter transistor INT9, a tenth inverter transistor INT10, a fourth capacitor C4, and a fifth capacitor C5. The output terminal of the (i−1)th inverter INi−1 may be connected to the second terminal of the ripple preventing capacitor C3 of the i-th stage SRCi.

Unlike as shown in FIG. 6, only the previous gate signal Gi−1 may be provided to a control electrode of the seventh inverter transistor INT7 and to a control electrode of the eighth inverter transistor INT8. The control electrode of the ninth inverter transistor INT9 and the control electrode of the tenth inverter transistor INT10 may be connected to the (i−1)th Q-node Qi−1. Specifically, the ninth inverter transistor INT9 may include a control electrode connected to the (i−1)th Q-node Qi−1, an input electrode connected to a voltage input terminal Vin for receiving the off-voltage VSS, and an output electrode connected to the output terminal of the (i−1)th inverter INi−1 through the fifth capacitor C5. The tenth inverter transistor INT10 may include a control electrode connected to the (i−1)th Q-node Qi−1, an input electrode connected to a voltage input terminal Vin for receiving the off-voltage VSS, and an output electrode connected to the output terminal of the (i−1)th inverter INn−1.

The ninth inverter transistor INT9 and the tenth inverter transistor INT 10 may be turned on in response to a level of the (i−1)th Q-node Qi−1 to provide the off-voltage VSS to the output terminal of the (i−1)th inverter INi−1. Thus, the output terminal of the (i−1)th inverter INi−1 may be stably maintained at the off-voltage VSS due to the ninth inverter transistor INT9 and the tenth inverter transistor INT10.

Figure 8:
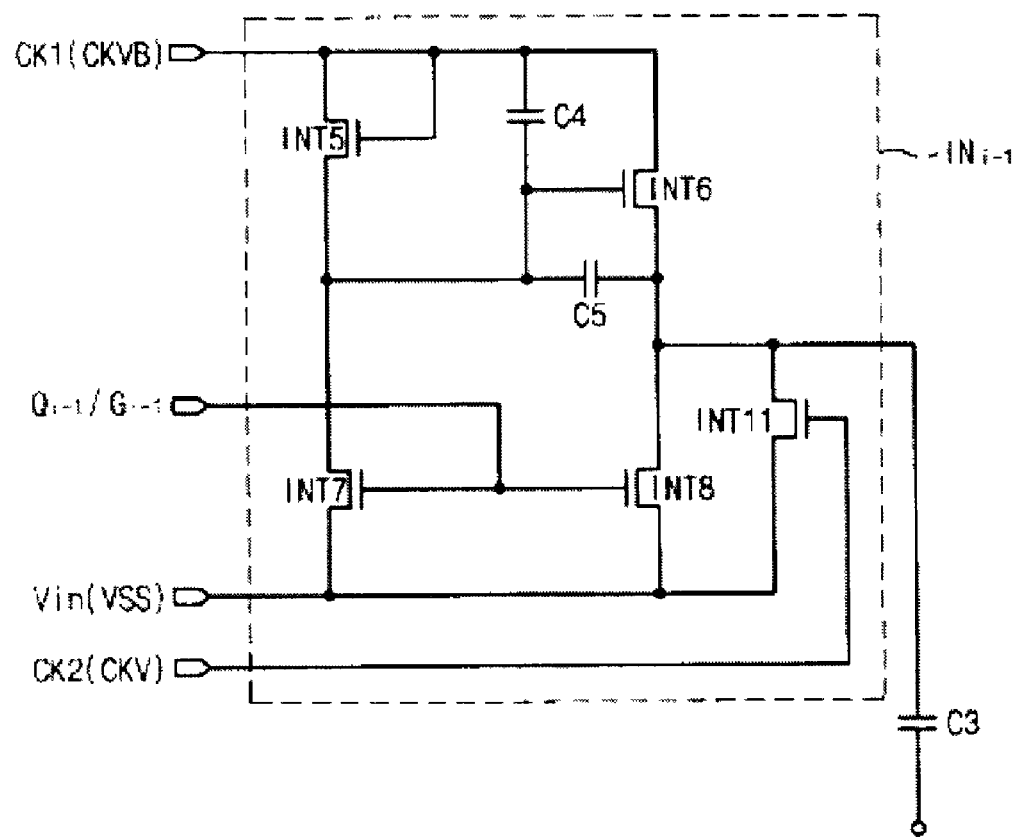
FIG. 8 is an equivalent circuit diagram showing an inverter according to another exemplary embodiment of the present invention.

FIG. 8 is an equivalent circuit diagram of an inverter according to another exemplary embodiment of the present invention. In FIG. 8, the same reference numerals denote the same or substantially similar elements as those shown in FIG. 6, and thus the detailed description of these elements will be omitted.

Referring to FIG. 8, the (i−1)th inverter may include a fifth inverter transistor INT5, a sixth inverter transistor INT6, a seventh inverter transistor INT7, an eighth inverter transistor INT8, an eleventh inverter transistor INT11, a fourth capacitor C4, and a fifth capacitor C5. The output terminal of the (i−1)th inverter may be connected to the second terminal of the ripple preventing capacitor C3 of the i-th stage SRCi.

The eleventh inverter transistor INT11 may include a control electrode connected to the second clock terminal CK2 for receiving the first clock signal CKV, an input electrode connected to a voltage input terminal Vin for receiving the off-voltage VSS, and an output electrode connected to the output terminal of the (i−1)th inverter INi−1.

The eleventh inverter transistor INT11 may be turned on in response to the first clock signal CKV having a high level, and may provide the off-voltage VSS to the output terminal of the (i−1)th inverter INi−1 when the second clock signal CKVB has a low level. That is, the off-voltage VSS may be output to the output terminal of the (i−1)th inverter during the i-th 1H period 1H(i) when the i-th gate signal Gi may have a high level.

Therefore, the (i−1)th inverter INi−1 may prevent the second clock signal CKVB from being applied to the ripple preventing capacitor C3 of the i-th stage during the i-th 1H period 1H(i). As a result, the (i−1)th inverter INi−1 may prevent a level of the i-th gate signal Gi from being lowered by the ripple preventing capacitor C3 during the i-th 1H period 1H(i).

Figure 9:
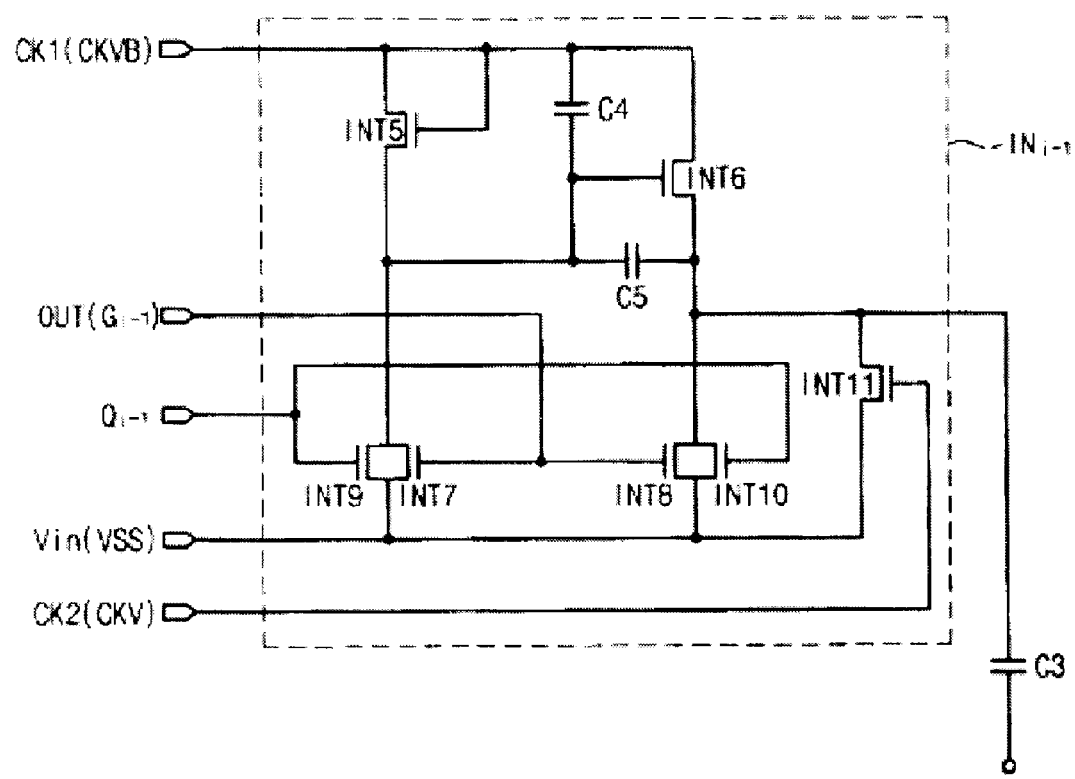
FIG. 9 is an equivalent circuit diagram showing an inverter according to another exemplary embodiment of the present invention.

FIG. 9 is an equivalent circuit diagram showing an inverter according to another exemplary embodiment of the present invention. In FIG. 9, the same reference numerals denote the same or substantially similar elements as shown in FIG. 8, and thus the detailed description of these elements will be omitted.

Referring to FIG. 9, the i-th inverter INi−1 may include a fifth inverter transistor INT5, a sixth inverter transistor INT6, a seventh inverter transistor INT7, an eighth inverter transistor INT8, a ninth inverter transistor INT9, a tenth inverter transistor INT10, an eleventh inverter transistor INT1, a fourth capacitor C4, and a fifth capacitor C5. The output terminal of the (i−1)th inverter INi−1 may be connected to the second terminal of the ripple preventing capacitor C3 of the i-th stage SRCi.

Unlike as shown in FIG. 8, only the previous gate signal Gi−1 may be provided to a gate electrode of the seventh inverter transistor INT7 and to a gate electrode of the eighth inverter transistor INT8. The gate electrode of the ninth inverter transistor INT9 and the gate electrode of the tenth inverter transistor INT10 may be connected to the (i−1)th Q-node Qi−1. Specifically, the ninth inverter transistor INT9 may include a control electrode connected to the (i−1)th Q-node Qi−1, an input electrode connected to a voltage input terminal Vin for receiving the off-voltage VSS, and an output electrode connected to the output terminal of the (i−1)th inverter INi−1 through the fifth capacitor C5. The tenth inverter transistor INT10 may include a control electrode connected to the (i−1)th Q-node Qi−1, an input electrode connected to a voltage input terminal Vin for receiving the off-voltage VSS, and an output electrode connected to the output terminal of the (i−1)th inverter INn−1.

The ninth inverter transistor INT9 and the tenth inverter transistor INT10 may be turned on in response to a level of the (i−1)th Q-node Qi−1 to provide the off-voltage VSS to the output terminal of the (i−1)th inverter INi−1. Thus, the output terminal of the (i−1)th inverter may be stably maintained at the off-voltage VSS by the ninth inverter transistor INT9 and the tenth inverter transistor INT10.

Figure 10:
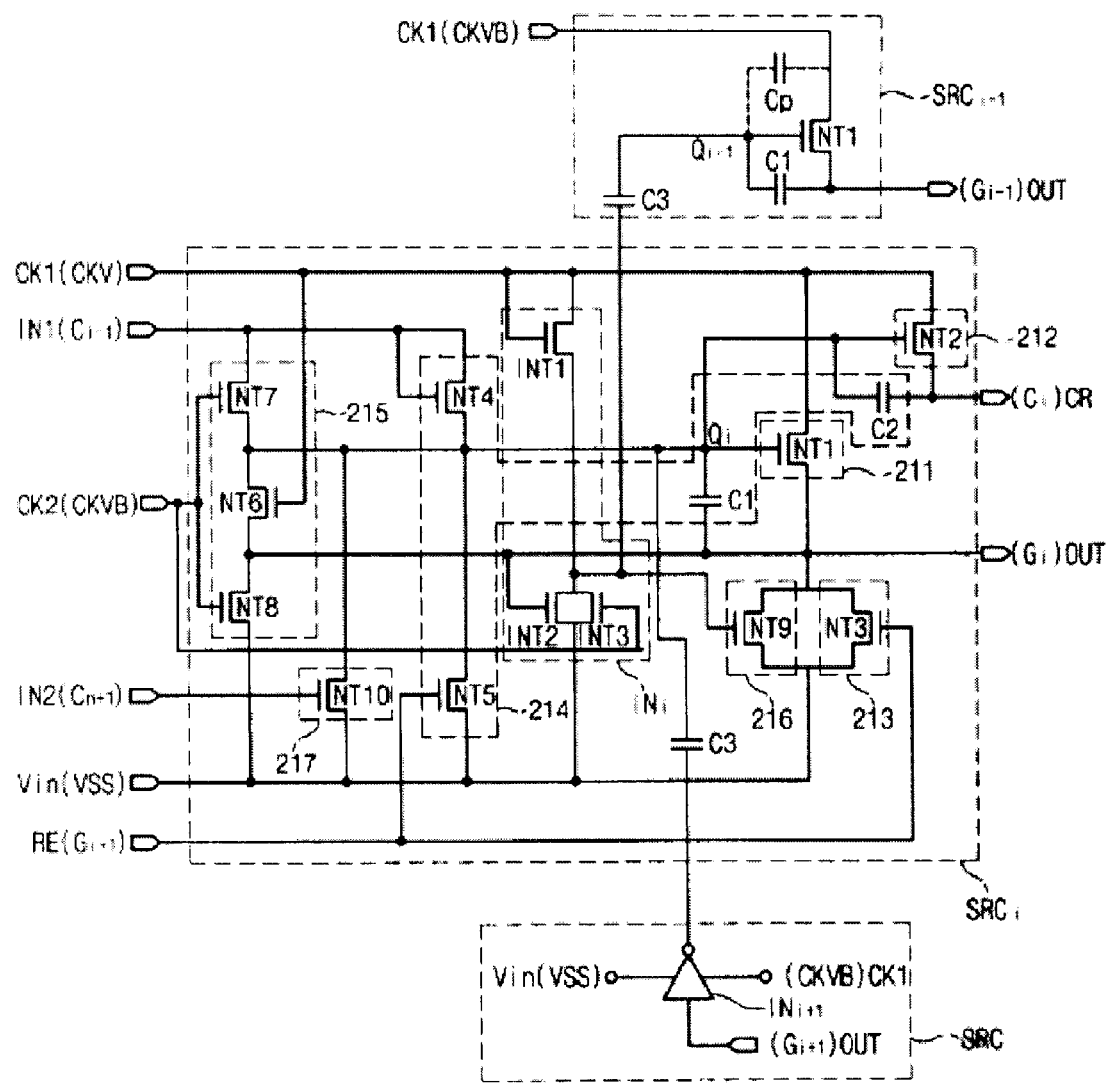
FIG. 10 is a circuit diagram showing a gate driving circuit stage according to another exemplary embodiment of the present invention.
Figure 11:
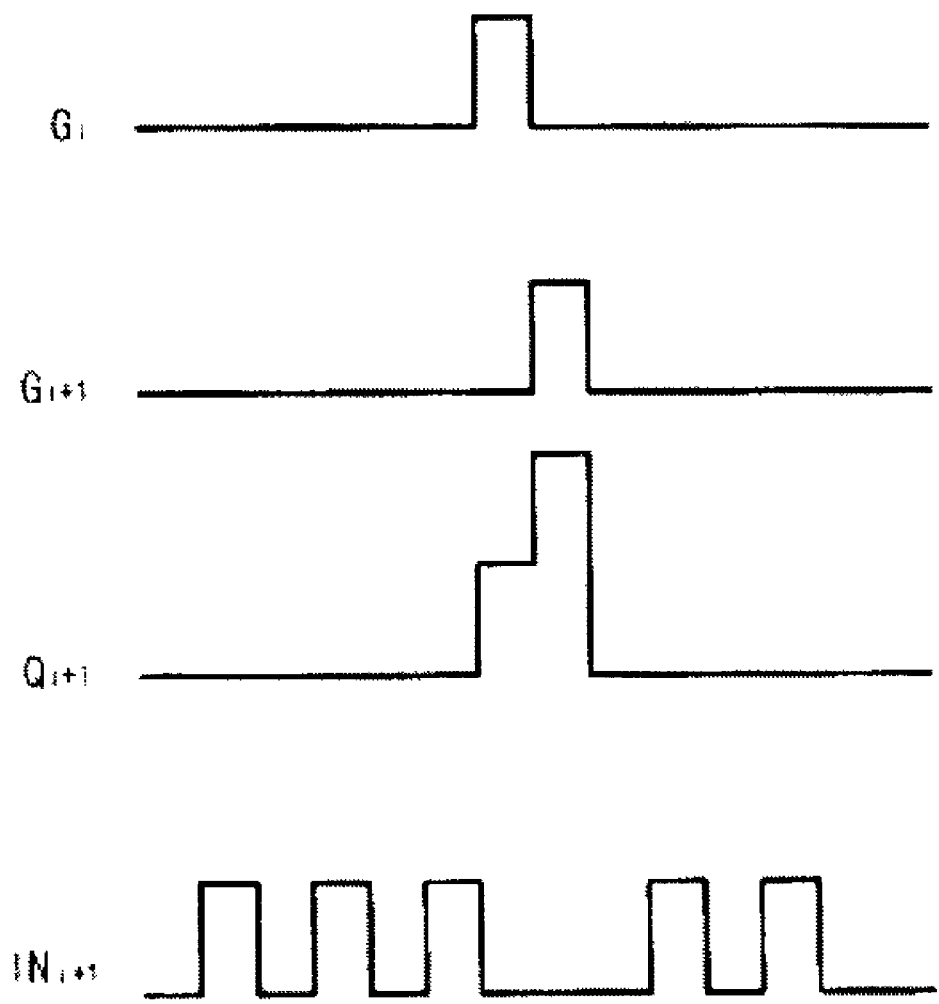
FIG. 11 is a waveform diagram showing an input signal and an output signal of an inverter shown in FIG. 10.

FIG. 10 is a circuit diagram of a gate driving circuit stage according to another exemplary embodiment of the present invention. FIG. 11 is a waveform diagram of an input signal and an output signal of an inverter shown in FIG. 10. In FIG. 10, the same reference numerals denote the same or substantially similar elements as shown in FIG. 3, and thus the detailed description of these elements will be omitted.

Referring to FIG. 10 and FIG. 11, the i-th stage SRCi may include a ripple preventing capacitor C3. The ripple preventing capacitor C3 may include a first terminal connected to the i-th Q-node Qi of the i-th stage and a second terminal connected to the output terminal of the (i+1)th inverter of the (i+1)th stage SRCi+1.

Also, the i-th inverter INi may be connected to the second terminal of a ripple preventing capacitor C3 of the (i−1)th stage SRCi−1. The parasitic capacitor Cp may be formed between a control electrode and an input electrode of the pull-up transistor NT1 of the (i−1)th stage SRCi−1. The second clock signal CKVB may be provided to the input electrode of the pull-up transistor NT1, and the first clock signal CKV output from the i-th inverter INi may be provided to the second terminal of the ripple preventing capacitor C3 of the (i−1)th stage SRCi−1.

The parasitic capacitor Cp may cause a ripple at the (i−1)th Q-node Qi−1, which may be connected to the control electrode of the pull-up transistor NT1, by the second clock signal CKVB. The ripple preventing capacitor C3 may receive the first clock signal CKV having an opposite level to the level of the second clock signal CKVB, and may thereby offset the ripple at the (i−1)th Q-node Qi−1.

However, the i-th inverter INi may output the off-voltage VSS not only during the i-th 1H period when the i-th gate voltage Gi has a high level, but also during the 1H period before the i-th 1H period (the (i−1)th 1H period) and during the 1H period after the i-th 1H period ((i+1)th 1H period). Thus, the i-th inverter INi may prevent a level of the i-th Q-node Qi−1 from transitioning to the off-voltage VSS during the (i−1)th 1H period when the (i−1)th gate signal Gi−1 has a high level.

As a result, the ripple preventing capacitor C3 of the (i−1)th stage SRCi−1 may be connected to the i-th inverter INi and charged or discharged by the i-th gate signal Gi provided to the i-th inverter INi or the level of the i-th Q-node Qi. Thus, the i-th inverter INi may prevent a ripple at the (i−1)th Q-node during the (i−1)th (n−1)H period and may also prevent a level of the (i−1)th gate signal Gi−1 from being lowered by the ripple preventing capacitor C3 during the (i−1)th 1H period.

The (i+1)th inverter INi+1 of the (i+1)th stage SRCi+1 may have substantially the same configuration as that of i-th inverter INi. In more detail, the (i+1)th inverter INi+1 may be connected to the second terminal of the ripple preventing transistor C3 of the i-th stage SRCi, so that the (i+1)th inverter INi+1 may charge or discharge the ripple preventing transistor C3 by outputting the second clock signal CKVB according to a level of the (i+1)th gate signal Gi+1 or a level of the (i+1)th Q-node Qi+1.

Particularly, the (i+1)th inverter INi+1 may output the off-voltage VSS not only during the (i+1)th 1H period when the (i+1)th gate signal Gi+1 has a high level, but also during the 1H period before the (i+1)-th 1H period (the i-th 1H period) and during the 1H period after the (i+1)th 1H period ((i+1)th 1H period). Thus, the (i+1)th inverter INi+1 may prevent a level of the i-th Q-node Qi from transitioning to the off-voltage VSS during the i-th 1H period when the i-th gate signal Gi has a high level.

Therefore, the (i+1)th inverter INi−1 may prevent a ripple at the i-th Q-node Qi during the (i+1)th (n−1)H period and may also prevent a level of the i-th gate signal Gi from being lowered by the ripple preventing capacitor C3 during the (i+1)th 1H period.

Although not shown in figures, the inverter of each stage shown in FIG. 10 may be applied to the various exemplary embodiments shown in FIG. 4, FIG. 6, FIG. 7, FIG. 8, and FIG. 9. However, the configuration of the inverter related to the above exemplary embodiments will be omitted in order to avoid the redundancy.

According to the gate driving circuit and the display apparatus of the present invention, the present stage may include a ripple preventing capacitor connected between a present stage node and the output terminal of a previous stage's inverter, or between a present stage node and the output terminal of a next inverter to prevent a ripple at the present stage node. Thus, a ripple of the present gate signal on the gate line may be prevented.

Also, the ripple preventing capacitor may be charged or discharged by the inverter connected to the second electrode of the ripple preventing capacitor. The inverter may be turned off during the 1H period when the present gate signal has a high level, to thereby prevent the voltage level of the present gate signal from being lowered during the 1H period. As a result, the gate driving circuit may have improved output characteristics.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A gate driving circuit, comprising:
   a first stage;
   a second stage connected in series with the first stage;
   and a third stage connected in series with the first stage and the second stage,
   wherein the second stage comprises:
   a present pull-up part to pull up a level of a present gate signal of the second stage;
   a carry part to pull up a level of a present carry signal of the second stage;
   a pull-down part to discharge the present gate signal to an off-voltage in response to a next gate signal from the third stage;
   a pull-up driving part to turn on the present pull-up part and the carry part in response to a previous carry signal of the first stage, and to turn off the present pull-up part and the carry part in response to the next gate signal, the pull-up driving part being connected to a present Q-node connected to a control terminal of the carry part and a control terminal of the present pull-up part;
   a holding part to maintain a level of the present gate signal at the off-voltage;
   a present inverter to turn on the holding part in response to a first clock signal;
   and a ripple preventing capacitor comprising a first terminal directly connected to the present Q-node and a second terminal directly connected to an output terminal of a previous inverter of the first stage to prevent a ripple at the present Q-node in response to an output signal from the previous inverter.

2. The gate driving circuit of claim 1, wherein the previous inverter comprises:
   a first inverter transistor including a control electrode and an input electrode to receive a second clock signal having a level opposite to a level of the first clock signal, and an output electrode connected to the output terminal of the previous inverter to boost the output signal of the previous inverter when the second clock signal has a high level;
   a second inverter transistor including a control electrode connected to an output terminal of a previous pull-up part of the first stage or a previous Q-node of the first stage, an input electrode to receive the off-voltage, and an output electrode connected to the output terminal of the previous inverter to lower the output signal of the previous inverter to the off-voltage; and
   a third inverter transistor including a control electrode to receive the first clock signal, an input electrode to receive the off-voltage, and an output electrode connected to the output terminal of the previous inverter to lower the output signal of the previous inverter to the off-voltage when the first clock signal has a high level.

3. The gate driving circuit of claim 2, wherein the control electrode of the second inverter transistor is connected to the output terminal of the previous pull-up part, and the previous inverter further comprises a fourth inverter transistor including a control electrode connected to the previous Q-node, an input electrode to receive the off-voltage, and an output electrode connected to the output terminal of the previous inverter.

4. The gate driving circuit of claim 1, wherein the previous inverter comprises:
a fifth inverter transistor including an input electrode to receive a second clock signal having a level opposite to that of the first clock signal, a control electrode to receive the second clock signal through a first capacitor, and an output electrode connected to the output terminal of the previous inverter and connected to the fifth inverter transistor control electrode through a second capacitor;
a sixth inverter transistor including a control electrode and an input electrode commonly connected to receive the second clock signal, and an output electrode connected to the second capacitor;
a seventh inverter transistor including a control electrode connected to the output terminal of a previous pull-up part of the first stage or a previous Q-node of the first stage, an input electrode to receive the off-voltage, and an output electrode connected to the output electrode of the sixth inverter transistor; and
an eighth inverter transistor including a control electrode connected to the control electrode of the seventh inverter transistor, an input electrode to receive the off-voltage, and an output electrode connected to the output terminal of the previous inverter.

5. The gate driving circuit of claim 4, wherein the control electrode of the seventh inverter transistor is connected to the output terminal of the previous pull-up part, and
wherein the previous inverter further comprises:
a ninth inverter transistor including a control electrode connected to the previous Q-node, an input electrode to receive the off-voltage, and an output electrode connected to the output electrode of the sixth inverter transistor; and
a tenth inverter transistor including a control electrode connected to the previous Q-node, an input electrode to receive the off-voltage, and an output electrode connected to the output terminal of the previous inverter.

6. The gate driving circuit of claim 4, wherein the previous inverter further comprises:
an eleventh inverter transistor including a control electrode to receive the first clock signal, an input electrode to receive the off-voltage, and an output electrode connected to the output terminal of the previous inverter.

7. The gate driving circuit of claim 6, wherein the control electrode of the seventh inverter transistor is connected to the output terminal of the previous pull-up part, and
wherein the previous inverter further comprises:
a ninth inverter transistor including a control electrode connected to the previous Q-node, an input electrode to receive the off-voltage, and an output electrode connected to the output electrode of the sixth inverter transistor; and
a tenth inverter transistor including a control electrode connected to the previous Q-node, an input electrode to receive the off-voltage, and an output electrode connected to the output terminal of the previous inverter.

8. The gate driving circuit of claim 1, wherein the holding part comprises:
a holding transistor including a control electrode connected to an output terminal of the present inverter of the second stage, an input electrode to receive the off-voltage, and an output electrode connected to the output terminal of the present pull-up part.

9. The gate driving circuit of claim 1, wherein the present pull-up part comprises:
a pull-up transistor including a control electrode connected to the present Q-node, an input electrode to receive the first clock signal, and an output electrode to output the present gate signal, and
wherein the carry part comprises:
a carry transistor including a control electrode connected to the present Q-node, an input electrode to receive the first clock, and an output electrode to output the present carry signal.

10. The gate driving circuit of claim 9, wherein the pull-up driving part comprises:
a buffer transistor including a control electrode and an input electrode commonly connected to receive the previous carry signal, and an output electrode connected to the present Q-node;
a first capacitor connected between the control electrode of the pull-up transistor and the output electrode of the pull-up transistor;
a second capacitor connected between the control electrode of the carry transistor and the output electrode of the carry transistor;
a discharge transistor including a control electrode to receive a next gate signal from the third stage, an input electrode to receive the off-voltage, and an output electrode connected to the output electrode of the buffer transistor.

11. A display apparatus, comprising:
a display part to display an image corresponding to a data signal in response to a gate signal;
a data driving circuit to apply the data signal to the display part;
and a gate driving circuit including a first stage, a second stage, and a third stage connected in series to output a previous gate signal, a present gate signal, and a next gate signal, respectively, to the display part, wherein the second stage comprises:
a present pull-up part to pull up a level of the present gate signal;
a carry part to pull up a level of a present carry signal of the second stage;
a pull-down part to discharge the present gate signal to an off-voltage in response to the next gate signal;
a pull-up driving part to turn on the present pull-up part and the carry part in response to a previous carry signal of the first stage, and to turn off the present pull-up part and the carry part in response to the next gate signal, the pull-up driving part being connected to a present Q-node connected to a control terminal of the carry part and a control terminal of the present pull-up part;
a holding part to maintain a level of the present gate signal at the off-voltage;
a present inverter to turn on the holding part in response to a first clock signal;
and a ripple preventing capacitor comprising a first terminal directly connected to the present Q-node and a second terminal directly connected to an output terminal of a previous inverter of the first stage to prevent a ripple at the present Q-node in response to an output signal from the previous inverter.

12. The display apparatus of claim 11, wherein the previous inverter comprises:
a first inverter transistor including a control electrode and an input electrode to receive a second clock signal having a level opposite to that of the first clock signal, and an output electrode connected to the output terminal of the previous inverter to boost the output signal of the previous inverter when the second clock signal has a high level;

a second inverter transistor including a control electrode connected to an output terminal of a previous pull-up part of the first stage or a previous Q-node of the first stage, an input electrode to receive the off-voltage, and an output electrode connected to the output terminal of the previous inverter to lower the output signal of the previous inverter to the off-voltage; and a third inverter transistor including a control electrode to receive the first clock signal, an input electrode to receive the off-voltage, and an output electrode connected to the output terminal of the previous inverter to lower the output signal of the previous inverter to the off-voltage when the first clock signal has a high level.

13. The display apparatus of claim 11, wherein the display part comprises:

an array substrate comprising a plurality of gate lines, a plurality of data lines, a thin film transistor outputting the data signal in response to a gate signal, and a pixel electrode receiving the data signal;

an opposite substrate comprising a common electrode facing the pixel electrode; and a liquid crystal layer disposed between the array substrate and the opposite substrate, the liquid crystal layer controlling a light transmittance thereof in response to an electric field generated between the pixel electrode and the common electrode.

14. The display apparatus of claim 13, wherein the gate driving circuit is formed on the array substrate through a thin film process used to form the thin film transistor.

* * * * *